US009838015B2

(12) United States Patent
Kung

(10) Patent No.: US 9,838,015 B2
(45) Date of Patent: Dec. 5, 2017

(54) APPARATUS FOR PERFORMING LEVEL SHIFT CONTROL IN AN ELECTRONIC DEVICE WITH AID OF PARALLEL PATHS CONTROLLED BY DIFFERENT CONTROL SIGNALS FOR CURRENT CONTROL PURPOSES

(71) Applicant: MEDIATEK INC., Hsin-Chu (TW)

(72) Inventor: Nien-Hui Kung, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/830,744

(22) Filed: Aug. 20, 2015

(65) Prior Publication Data
US 2016/0269028 A1 Sep. 15, 2016

Related U.S. Application Data

(60) Provisional application No. 62/131,262, filed on Mar. 11, 2015.

(51) Int. Cl.
*H03L 5/00* (2006.01)
*H03K 19/0185* (2006.01)
*H03K 3/012* (2006.01)
*H03K 3/356* (2006.01)
*H03K 19/00* (2006.01)
*H03K 17/042* (2006.01)
*H03K 19/003* (2006.01)

(52) U.S. Cl.
CPC ..... *H03K 19/018507* (2013.01); *H03K 3/012* (2013.01); *H03K 3/35613* (2013.01); *H03K 3/356182* (2013.01); *H03K 17/04206* (2013.01); *H03K 19/0013* (2013.01); *H03K 19/00384* (2013.01)

(58) Field of Classification Search
CPC ........... H03K 3/356; H03K 19/018521; H03K 19/00315; H03K 17/102; H03K 3/012
USPC ................... 327/306, 333; 326/60–61, 80–81
See application file for complete search history.

(56) References Cited

U.S. PATENT DOCUMENTS 5,896,043 A 4/1999 Kumagai
7,839,197 B2 * 11/2010 Chen ....................... H03K 3/012
326/68

(Continued)

FOREIGN PATENT DOCUMENTS

WO 2014171190 A1 10/2014

*Primary Examiner* — Dinh T Le
(74) *Attorney, Agent, or Firm* — Winston Hsu

(57) ABSTRACT

An apparatus for performing level shift control in an electronic device includes an input stage positioned in a level shifter of the electronic device, and an output stage positioned in the level shifter and coupled to the input stage through a set of intermediate nodes. The input stage is arranged for receiving at least one input signal of the level shifter through at least one input terminal of the input stage and controlling voltage levels of the set of intermediate nodes according to the at least one input signal. The input stage includes a hybrid current control circuit coupled to the at least one input terminal and arranged for performing current control for the input stage. The hybrid current control circuit is equipped with multiple sets of parallel paths for controlling currents passing through the set of intermediate nodes, respectively, each set may include two or more paths in parallel.

24 Claims, 14 Drawing Sheets

(56) References Cited

U.S. PATENT DOCUMENTS

| | | | | |
|---|---|---|---|---|
| 7,952,389 B2* | 5/2011 | Aoki | ............... | H03K 3/35613 |
| | | | | 326/63 |
| 8,907,712 B2* | 12/2014 | Chiang | ............... | H03L 5/00 |
| | | | | 327/333 |
| 2007/0236271 A1 | 10/2007 | Nuebling | | |
| 2010/0109743 A1* | 5/2010 | Czech | ............... | H03K 17/102 |
| | | | | 327/333 |

* cited by examiner

APPARATUS FOR PERFORMING LEVEL SHIFT CONTROL IN AN ELECTRONIC DEVICE WITH AID OF PARALLEL PATHS CONTROLLED BY DIFFERENT CONTROL SIGNALS FOR CURRENT CONTROL PURPOSES

CROSS REFERENCE TO RELATED APPLICATIONS

This application claims the benefit of U.S. Provisional Application No. 62/131,262, which was filed on Mar. 11, 2015, and is included herein by reference.

BACKGROUND

The present invention relates to reducing a direct current (DC) bias during level shifting, and more particularly, to an apparatus for performing level shift control in an electronic device.

A conventional level shift circuit may suffer from some problems corresponding to the architecture thereof, such as a low speed problem due to large parasitic capacitance of some high voltage device, and another problem due to the high swing level of the upper side thereof. For example, the propagation delay may reach five nanoseconds (ns), which may degrade the overall performance of the conventional electronic device in which the conventional level shift circuit is installed. According to the related art, it is proposed to reduce the swing level by adding clamping circuits into this conventional level shift circuit. However, additional problems such as some side effects may be introduced. For example, adding the clamping circuits may cause huge quiescent, and may increase the DC bias, where the DC bias may approach zero before the clamping circuits are added.

Another conventional level shift circuit such as that in the U.S. Pat. No. 7,839,197 is proposed to improve the speed, and the clamping circuits may further be added into the other conventional level shift circuit as mentioned above when needed, but the current sources in the conventional current control circuit of the other conventional level shift circuit may cause large boot voltage leakage. As a result, the whole regulator implemented by using the other conventional level shift circuit may encounter an out of regulation problem when a light load is applied. Although the speed is improved, the DC bias is greatly increased. For example, the DC bias in the other conventional level shift circuit may reach ten microamperes ($\mu A$).

In conclusion, there are many problems in the conventional level shift circuits. Thus, a novel architecture is required to improve the speed with fewer side effects, in order to guarantee the overall performance of the whole system.

SUMMARY

It is an objective of the claimed invention to provide an apparatus for performing level shift control in an electronic device, in order to solve the above-mentioned problems.

It is another objective of the claimed invention to provide an apparatus for performing level shift control in an electronic device, in order to improve the operational speed during level shifting with fewer side effects.

It is yet another objective of the claimed invention to provide an apparatus for performing level shift control in an electronic device, in order to guarantee the performance of a level shifter in the electronic device with fewer design efforts and to improve the overall performance of the electronic device.

According to at least one preferred embodiment, an apparatus for performing level shift control in an electronic device is provided, where the apparatus may comprise at least one portion (e.g. a portion or all) of the electronic device. The apparatus comprises an input stage that is positioned in a level shifter of the electronic device, and further comprises an output stage that is positioned in the level shifter and coupled to the input stage through a set of intermediate nodes. The input stage is arranged for receiving at least one input signal of the level shifter through at least one input terminal of the input stage and controlling voltage levels of the set of intermediate nodes according to the at least one input signal. More particularly, the input stage comprises a hybrid current control circuit that is coupled to the at least one input terminal. In addition, the hybrid current control circuit is arranged for performing current control for the input stage, wherein the hybrid current control circuit is equipped with multiple sets of parallel paths for controlling currents passing through the set of intermediate nodes, respectively, each set of the multiple sets of parallel paths comprises a first path on which a first switching unit and at least one passive component are positioned, and further comprises a second path on which a second switching unit is positioned, and the first switching unit and the second switching unit are controlled by different control signals, respectively. Additionally, the output stage is arranged for driving at least one output signal of the level shifter through at least one output terminal of the output stage and controlling at least one voltage level of the at least one output terminal according to the voltage levels of the set of intermediate nodes.

According to at least one preferred embodiment, an apparatus for performing level shift control in an electronic device is provided, where the apparatus may comprise at least one portion (e.g. a portion or all) of the electronic device. The apparatus comprises an input stage that is positioned in a level shifter of the electronic device, and further comprises an output stage that is positioned in the level shifter and coupled to the input stage through a set of intermediate nodes. The input stage is arranged for receiving at least one input signal of the level shifter through at least one input terminal of the input stage and controlling voltage levels of the set of intermediate nodes according to the at least one input signal. More particularly, the input stage comprises a hybrid current control circuit that is coupled to the at least one input terminal. In addition, the hybrid current control circuit is arranged for performing current control for the input stage, wherein the hybrid current control circuit is equipped with multiple sets of parallel paths for controlling currents passing through the set of intermediate nodes, respectively, each set of the multiple sets of parallel paths comprises a first path on which a first switching unit is positioned, and comprises a second path on which a second switching unit is positioned, and further comprises a third path on which at least one passive component is positioned, and the first switching unit and the second switching unit are controlled by different control signals, respectively. Additionally, the output stage is arranged for driving at least one output signal of the level shifter through at least one output terminal of the output stage and controlling at least one voltage level of the at least one output terminal according to the voltage levels of the set of intermediate nodes.

It is an advantage of the present invention that the present invention apparatus can improve the operational speed during level shifting with fewer side effects, and can guarantee the performance of the level shifter in the electronic device with fewer design efforts and fewer side effects, and can improve the overall performance of the electronic device. For example, the present invention apparatus can reduce the leakage of a boot voltage significantly by the reduction of the on duty of a bias current in the level shift circuit. In comparison with the conventional level shift circuit, the direct current (DC) bias can be greatly reduced, without increasing the propagation delay. For example, the propagation delay can be kept around one nanosecond (ns).

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
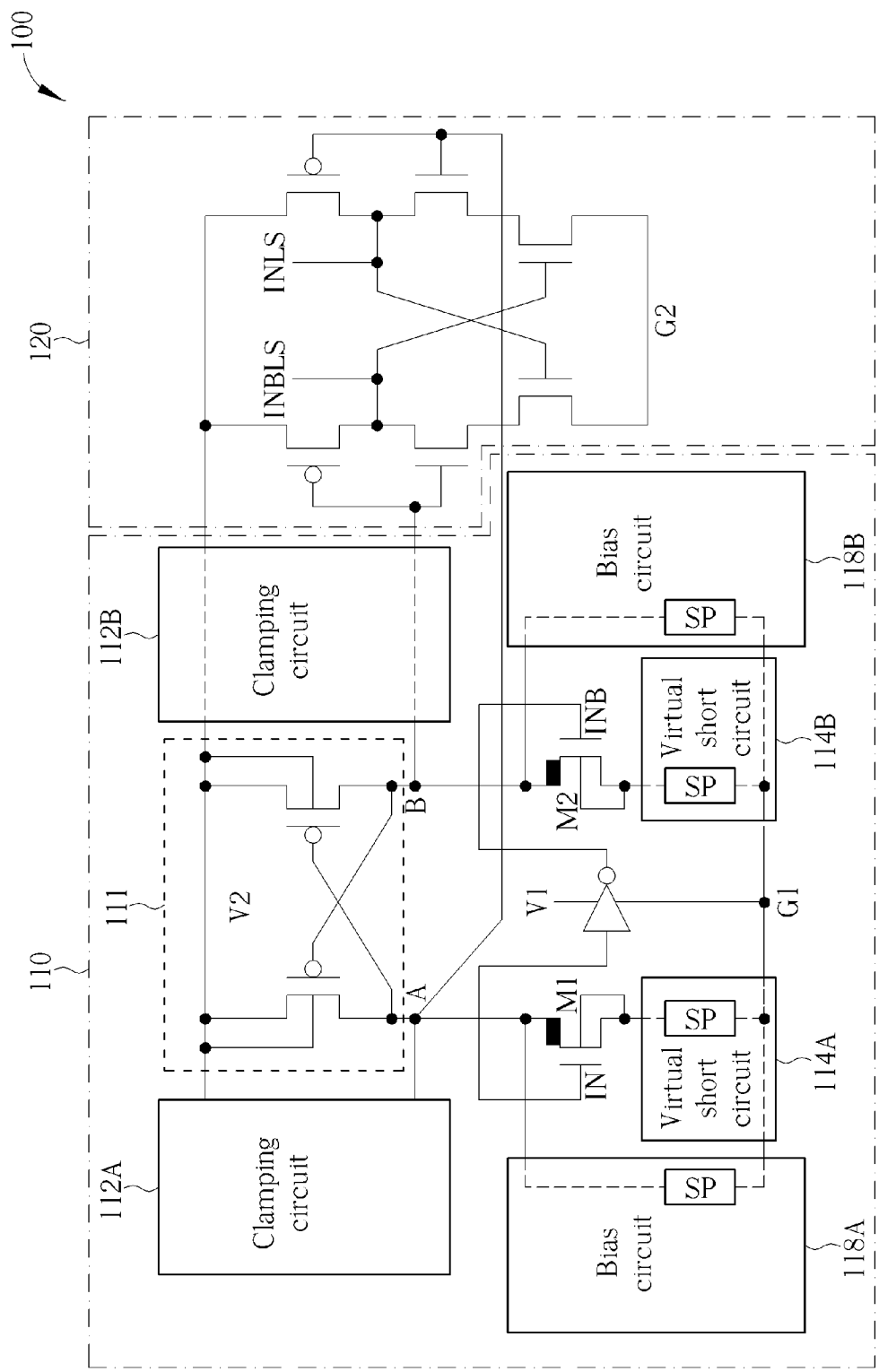
FIG. 1 is a diagram of an apparatus for performing level shift control in an electronic device according to an embodiment of the present invention.

FIG. 1 is a diagram of an apparatus for performing level shift control in an electronic device according to an embodiment of the present invention, where the apparatus 100 comprises at least one portion (e.g. a portion or all) of the electronic device. For example, the apparatus 100 may comprise a portion of the electronic device mentioned above, and more particularly, can be at least one hardware circuit such as at least one integrated circuit (IC) within the electronic device. In another example, the apparatus 100 can be the whole of the electronic device mentioned above. In another example, the apparatus 100 may comprise a system comprising the electronic device mentioned above (e.g. an audio/video system comprising the electronic device). Examples of the electronic device may include, but not limited to, a mobile phone (e.g. a multifunctional mobile phone), tablet, and a personal computer such as a laptop computer.

As shown in FIG. 1, the apparatus 100 may comprise an input stage 110 that is positioned in a level shifter of the electronic device, and further comprises an output stage 120 that is positioned in the level shifter and coupled to the input stage 110 through a set of intermediate nodes A and B. According to this embodiment, the input stage 110 may comprise a switching circuit 111, a set of clamping circuits 112A and 112B, and a hybrid current control circuit, which may comprise a set of switching units M1 and M2, an inverter coupled between the set of switching units M1 and M2, a set of virtual short circuits 114A and 114B, and a set of bias circuits 118A and 118B in this embodiment, where the set of switching units M1 and M2 can be implemented with two Metal Oxide Semiconductor Field Effect Transistors (MOSFETs) such as two N-type MOSFETs (NMOSFETs), and the shaded portion illustrated on the uppermost of each of the set of switching units M1 and M2 may indicate that they can be implemented as high voltage (HV) devices having large parasitic capacitance. In addition, the output stage 120 may comprise some switching units and associated wirings, such as those shown around the rightmost of FIG. 1. In the architecture shown in FIG. 1, some P-type MOSFETs (PMOSFETs) such as those within the switching circuit 111 and those within in the output stage 120 are utilized for selectively coupling associated nodes or terminals to the reference voltage level V2, respectively, some NMOSFETs such as those within the set of switching units M1 and M2 are utilized for selectively coupling associated nodes or terminals to the reference voltage level G1, respectively, and some NMOSFETs such as those within in the output stage 120 are utilized for selectively coupling associated nodes or terminals to the reference voltage level G2, respectively. This is for illustrative purposes only, and is not meant to be a limitation of the present invention. According to some embodiments, implementations of these switching components are not limited to be NMOSFETs or PMOSFETs. According to some embodiments, the connection of the body bias of a MOSFET such as that of any of these switching components are not limited to be the corresponding connection shown in FIG. 1.

According to this embodiment, the input stage 110 may be arranged for receiving at least one input signal of the level shifter through at least one input terminal of the input stage 110, such as the input terminal IN, and controlling voltage levels of the set of intermediate nodes A and B according to the aforementioned at least one input signal. For example, the inverter coupled between the set of switching units M1 and M2, and more particularly, coupled between the input terminals IN and INB, may be supplied by the reference voltage levels V1 and G1, and may invert the input signal at the input terminal IN to generate another input signal at the input terminal INB, such as an inverted signal of the input signal at the input terminal IN, where the input terminal IN is arranged to receive the aforementioned at least one input signal, and the input terminal INB is arranged to receive the inverted signal. More particularly, the input stage 110 may comprises a set of switching units coupled to the aforementioned at least one input terminal, such as the PMOSFETs within the switching circuit 111 shown in FIG. 1, and this set of switching units may be arranged for controlling the voltage levels of the set of intermediate nodes A and B in response to the aforementioned at least one input signal. For example, according to the aforementioned at least one input signal, a switching unit of this set of switching units may selectively couple one of the set of intermediate nodes A and B to a predetermined voltage level supplied to the level shifter, such as the reference voltage level V2 in this embodiment. In addition, the output stage 120 may be arranged for driving at least one output signal of the level shifter through at least one output terminal of the output stage 120, such as the output terminal INLS, and controlling at least one voltage level of the at least one output terminal according to the voltage levels of the set of intermediate nodes A and B. For example, as a result of the circuit arrangement within the output stage 120, the output signal at the output terminal INLS can be regarded as an inverted version of another output signal at the output terminal INBLS, and vice versa.

As shown in FIG. 1, the hybrid current control circuit, which may comprise the set of switching units M1 and M2, the inverter mentioned above, the set of virtual short circuits 114A and 114B, and the set of bias circuits 118A and 118B in this embodiment, is coupled to the aforementioned at least one input terminal such as the input terminal IN. This hybrid current control circuit may be arranged for performing current control for the input stage 110, and may operate in response to the input signal received from the input terminal IN. For example, the virtual short circuits 114A and 114B can be utilized for performing virtual short operations for the terminals AA and BB to their ground (e.g. the reference voltage level G1), respectively, and, in one aspect, the bias circuits 118A and 118B can be regarded as the bias circuits for the clamping circuits 112A and 112B, respectively. In addition, the hybrid current control circuit is equipped with multiple sets of parallel paths, such as some sub-paths (labeled "SP" in FIG. 1, for brevity), for controlling currents passing through the set of intermediate nodes A and B, respectively, where a set of parallel paths within the aforementioned multiple sets of parallel paths may comprise signal paths (or sub-paths) that are electrically connected in parallel. For example, the input stage 110 may comprise at least one sub-path (e.g. one or more sub-paths) in the virtual short circuit 114A and may comprise at least one sub-path (e.g. one or more sub-paths) in the bias circuit 118A, and these sub-paths and/or their extended signal paths may be connected in parallel within this hybrid current control circuit. In another example, the input stage 110 may comprise at least one sub-path (e.g. one or more sub-paths) in the virtual short circuit 114B and may comprise at least one sub-path (e.g. one or more sub-paths) in the bias circuit 118B, and these sub-paths and/or their extended signal paths may be connected in parallel within this hybrid current control circuit.

According to some embodiments of the present invention, such as the embodiments respectively shown in FIGS. 2-7, each set of the aforementioned multiple sets of parallel paths may comprise a first path on which a first switching unit and at least one passive component are positioned, and may further comprise a second path on which a second switching unit is positioned. In addition, the first switching unit and the second switching unit can be controlled by different control signals, respectively. For example, the input stage 110 may comprise a plurality of switching units, each of which is positioned on a path within the multiple sets of parallel paths, where the plurality of switching units may comprise the first switching unit on the first path and the second switching unit on the second path. This is for illustrative purposes only, and is not meant to be a limitation of the present invention.

Figure 2:
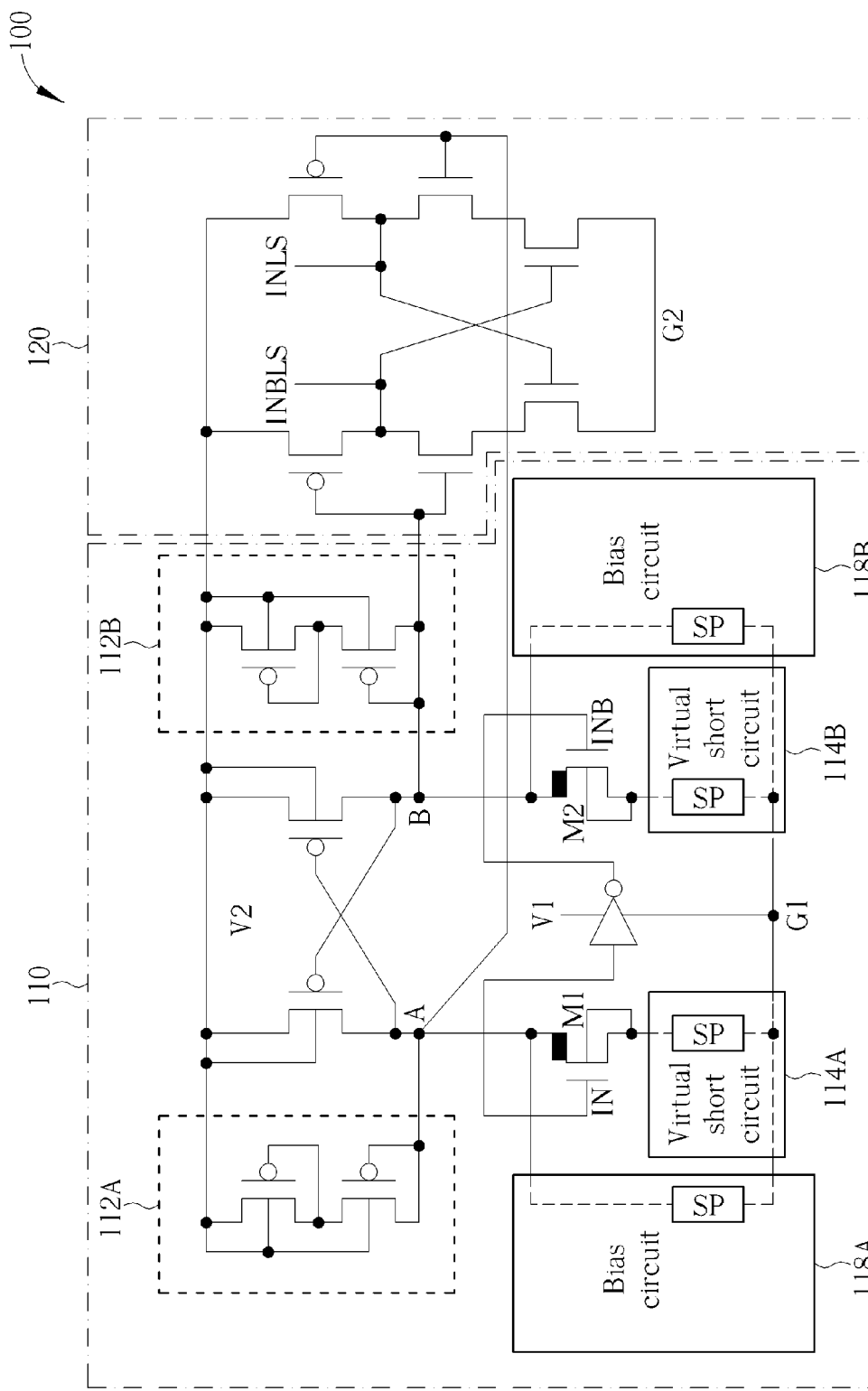
FIG. 2 illustrates a set of clamping circuits involved with the apparatus shown in FIG. 1 according to an embodiment of the present invention.

FIG. 2 illustrates the set of clamping circuits 112A and 112B involved with the apparatus 100 shown in FIG. 1 according to an embodiment of the present invention. This set of clamping circuits 112A and 112B may be positioned in the level shifter and respectively coupled to the set of intermediate nodes A and B, and may be arranged for clamping the voltage levels of the set of intermediate nodes A and B, respectively. In the architecture shown in FIG. 2, some PMOSFETs such as those within the clamping circuits 112A and 112B are utilized for selectively coupling associated nodes or terminals to the reference voltage level V2, respectively. This is for illustrative purposes only, and is not meant to be a limitation of the present invention. According to some embodiments, implementations of these switching components are not limited to be PMOSFETs. According to some embodiments, the connection of the body bias of a MOSFET such as that of any of these switching components are not limited to be the corresponding connection shown in FIG. 2.

Figure 3:
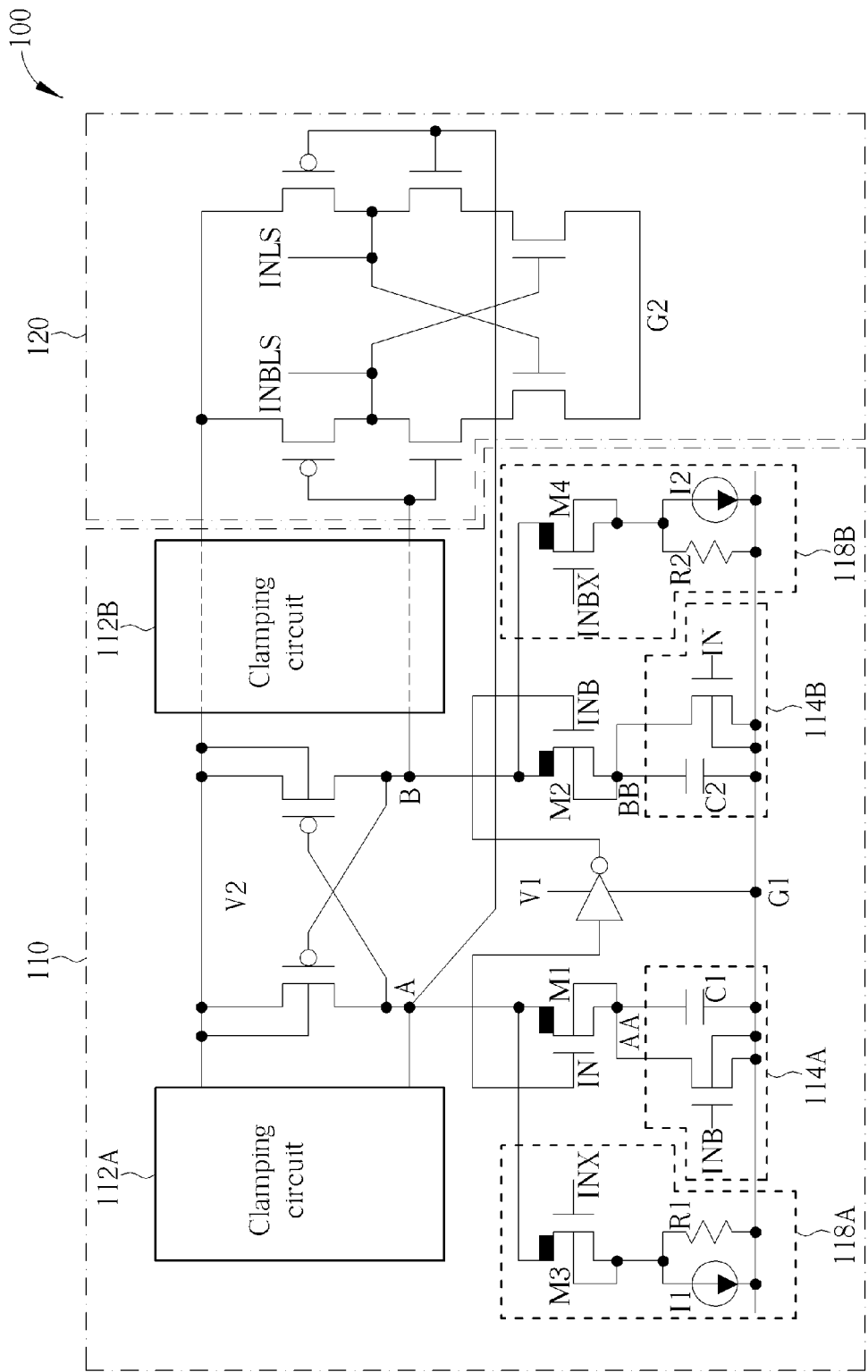
FIG. 3 illustrates some implementation details of the multiple sets of parallel paths involved with the apparatus shown in FIG. 1 according to an embodiment of the present invention.

FIG. 3 illustrates some implementation details of the multiple sets of parallel paths involved with the apparatus 100 shown in FIG. 1 according to an embodiment of the present invention. As shown in FIG. 3, the aforementioned hybrid current control circuit may comprise a plurality of capacitors C1 and C2, at least one capacitor of which may be positioned on the first path of this embodiment and is utilized as the aforementioned at least one passive component in this embodiment. In addition, the hybrid current control circuit may further comprise a plurality of current sources I1 and I2, at least one current source of which may be positioned on the second path of this embodiment. Additionally, the hybrid current control circuit may further comprise a plurality of resistors R1 and R2, at least one resistor of which may be positioned on the second path of this embodiment. Further, the hybrid current control circuit may further comprise other switching units such as those positioned in the set of virtual short circuits 114A and 114B and the set of bias circuits 118A and 118B, respectively, where these switching units (e.g. the switching units M3, M4, etc.) can also be implemented with MOSFETs such as NMOSFETs, and the shaded portion illustrated on the uppermost of each of the switching units M3 and M4 may indicate that they can be implemented as HV devices having large parasitic capacitance.

According to this embodiment, a first set of parallel paths within the multiple sets of parallel paths may be arranged for controlling the current passing through one intermediate node within the set of intermediate nodes A and B, such as the intermediate node A, and a second set of parallel paths within the multiple sets of parallel paths may be arranged for controlling the current passing through another intermediate node within the set of intermediate nodes A and B, such as the intermediate node B. For example, regarding the first set of parallel paths, the aforementioned first path may represent the signal path passing through the switching unit M1 and the virtual short circuit 114A, and the aforementioned second path may represent the signal path passing through the bias circuit 118A, where the aforementioned at least one passive component may represent the capacitor C1, and the first switching unit such as the switching unit M1 and the second switching unit such as the switching unit M3 can be controlled by different control signals at the terminals IN and INX, respectively. In another example, regarding the second set of parallel paths, the aforementioned first path may represent the signal path passing through the switching unit M2 and the virtual short circuit 114B, and the aforementioned second path may represent the signal path passing through the bias circuit 118B, where the aforementioned at least one passive component may represent the capacitor C2, and the first switching unit such as the switching unit M2 and the second switching unit such as the switching unit M4 can be controlled by different control signals at the terminals INB and INBX, respectively.

Please note that, in the architecture shown in FIG. 3, some NMOSFETs such as those within the switching units M1 and M2, the virtual short circuits 114A and 114B, and the bias circuits 118A and 118B are utilized for selectively coupling associated nodes or terminals to the reference voltage level G1, respectively. This is for illustrative purposes only, and is not meant to be a limitation of the present invention. According to some embodiments, implementations of these switching components are not limited to be NMOSFETs. According to some embodiments, the connection of the body bias of a MOSFET such as that of any of these switching components are not limited to be the corresponding connection shown in FIG. 3.

Figure 4:
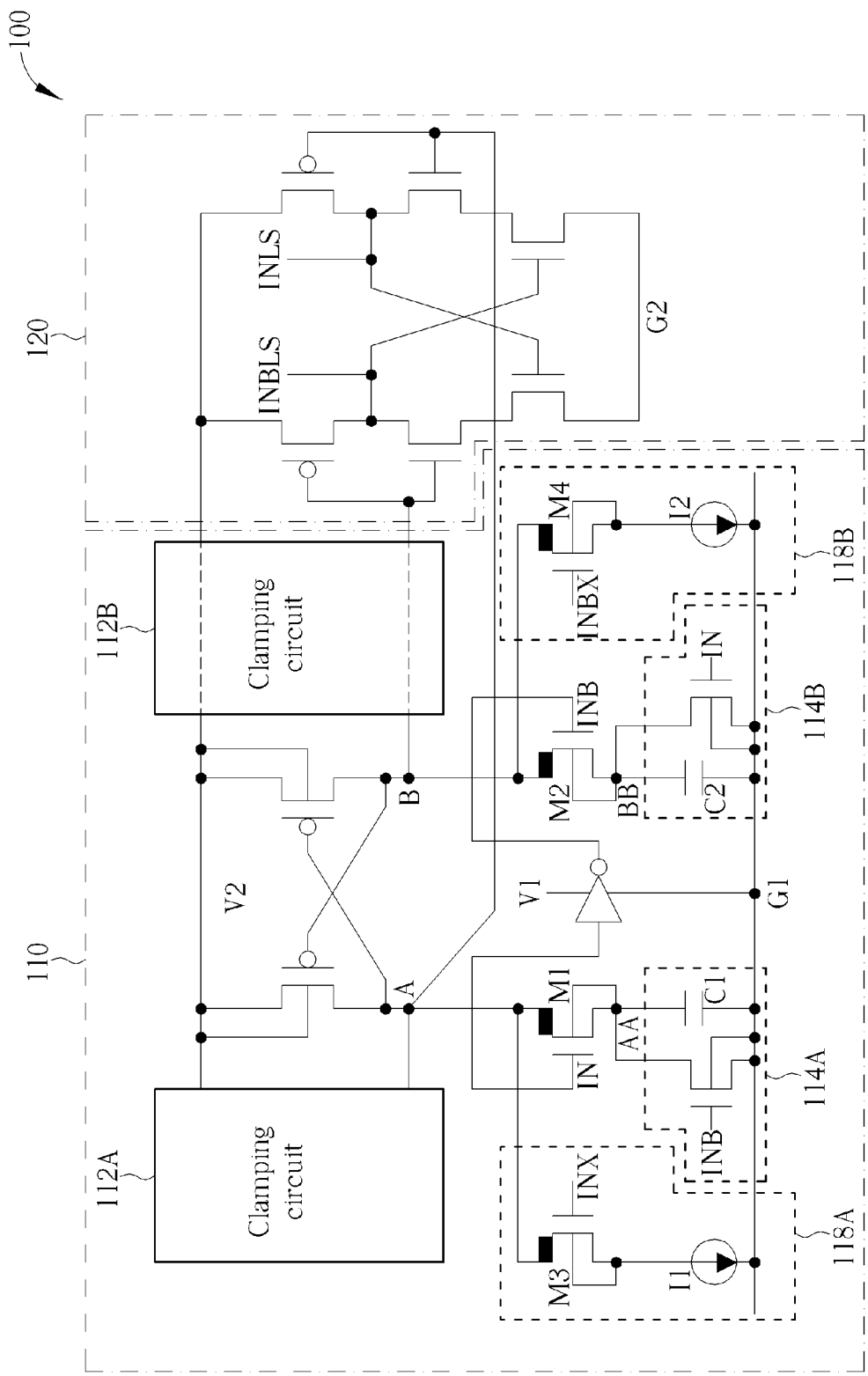
FIG. 4 illustrates some implementation details of the multiple sets of parallel paths involved with the apparatus shown in FIG. 1 according to another embodiment of the present invention.

FIG. 4 illustrates some implementation details of the multiple sets of parallel paths involved with the apparatus 100 shown in FIG. 1 according to another embodiment of the present invention. In comparison with the architecture shown in FIG. 3, the resistors R1 and R2 can be removed in this embodiment. For brevity, similar descriptions for this embodiment are not repeated in detail here.

Figure 5:
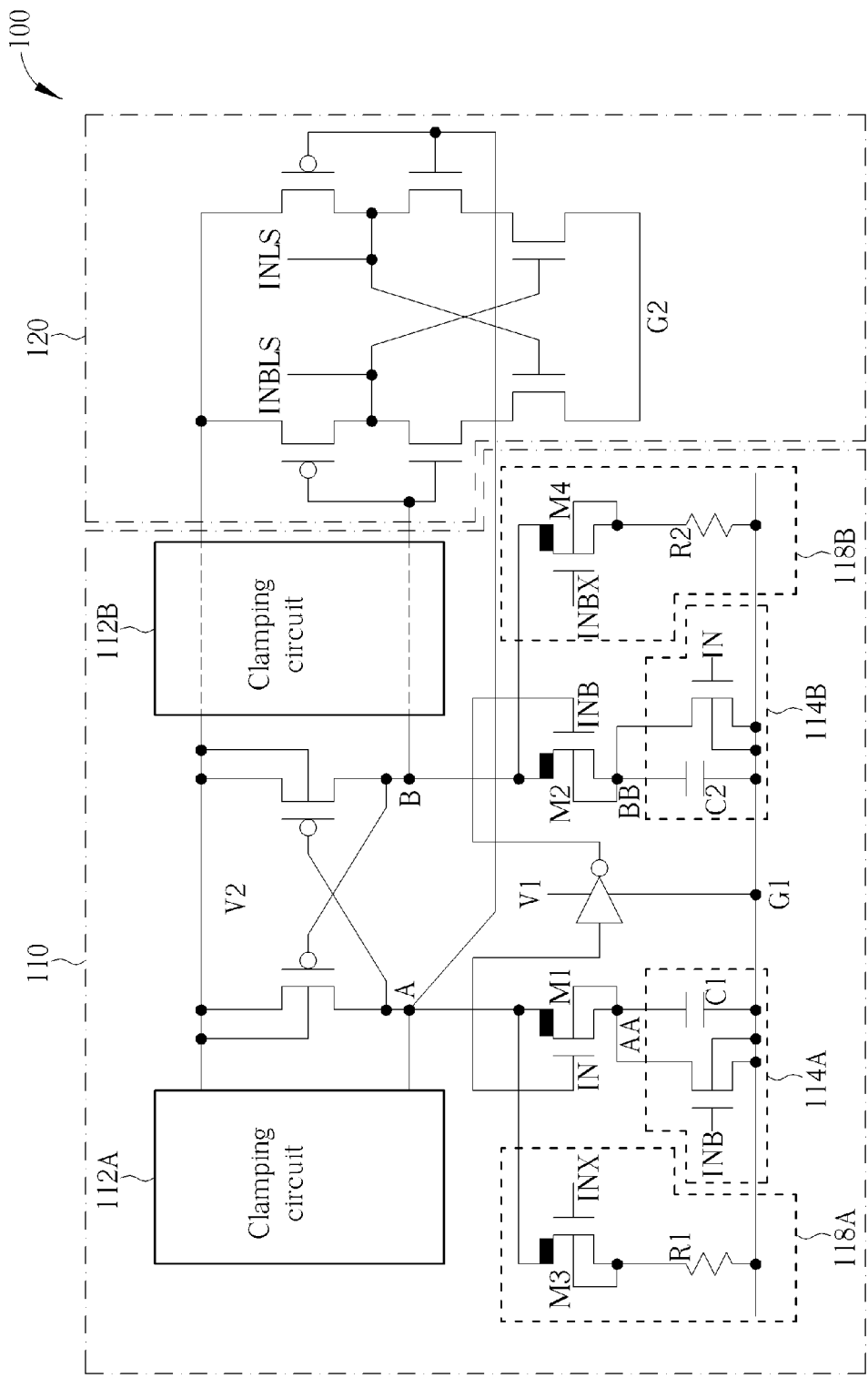
FIG. 5 illustrates some implementation details of the multiple sets of parallel paths involved with the apparatus shown in FIG. 1 according to another embodiment of the present invention.

FIG. 5 illustrates some implementation details of the multiple sets of parallel paths involved with the apparatus 100 shown in FIG. 1 according to another embodiment of the present invention. In comparison with the architecture shown in FIG. 3, the current sources I1 and I2 can be removed in this embodiment. For brevity, similar descriptions for this embodiment are not repeated in detail here.

Figure 6:
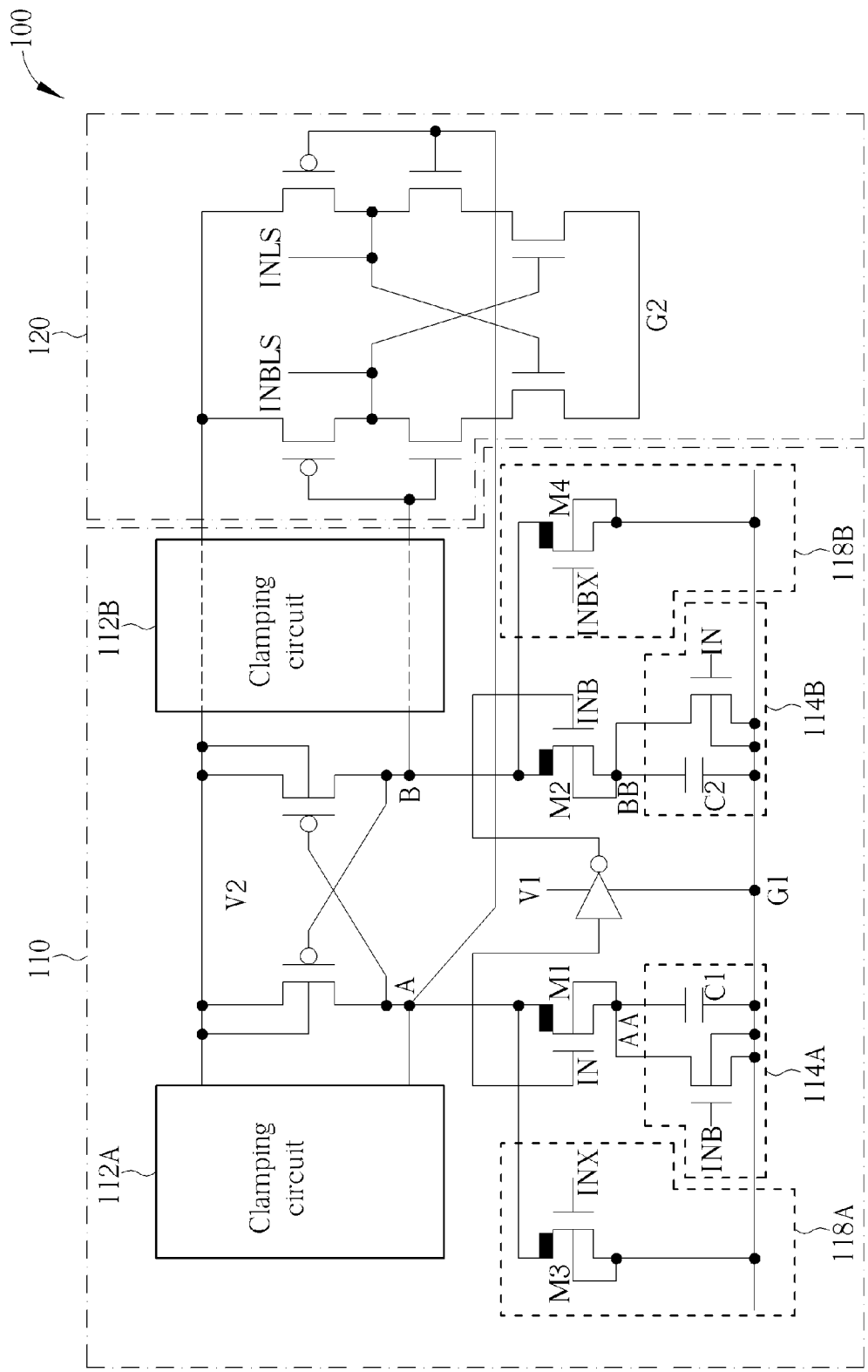
FIG. 6 illustrates some implementation details of the multiple sets of parallel paths involved with the apparatus shown in FIG. 1 according to another embodiment of the present invention.

FIG. 6 illustrates some implementation details of the multiple sets of parallel paths involved with the apparatus 100 shown in FIG. 1 according to another embodiment of the present invention. In comparison with the architecture shown in FIG. 3, the resistors R1 and R2 and the current sources I1 and I2 can be removed in this embodiment. For brevity, similar descriptions for this embodiment are not repeated in detail here.

Figure 7:
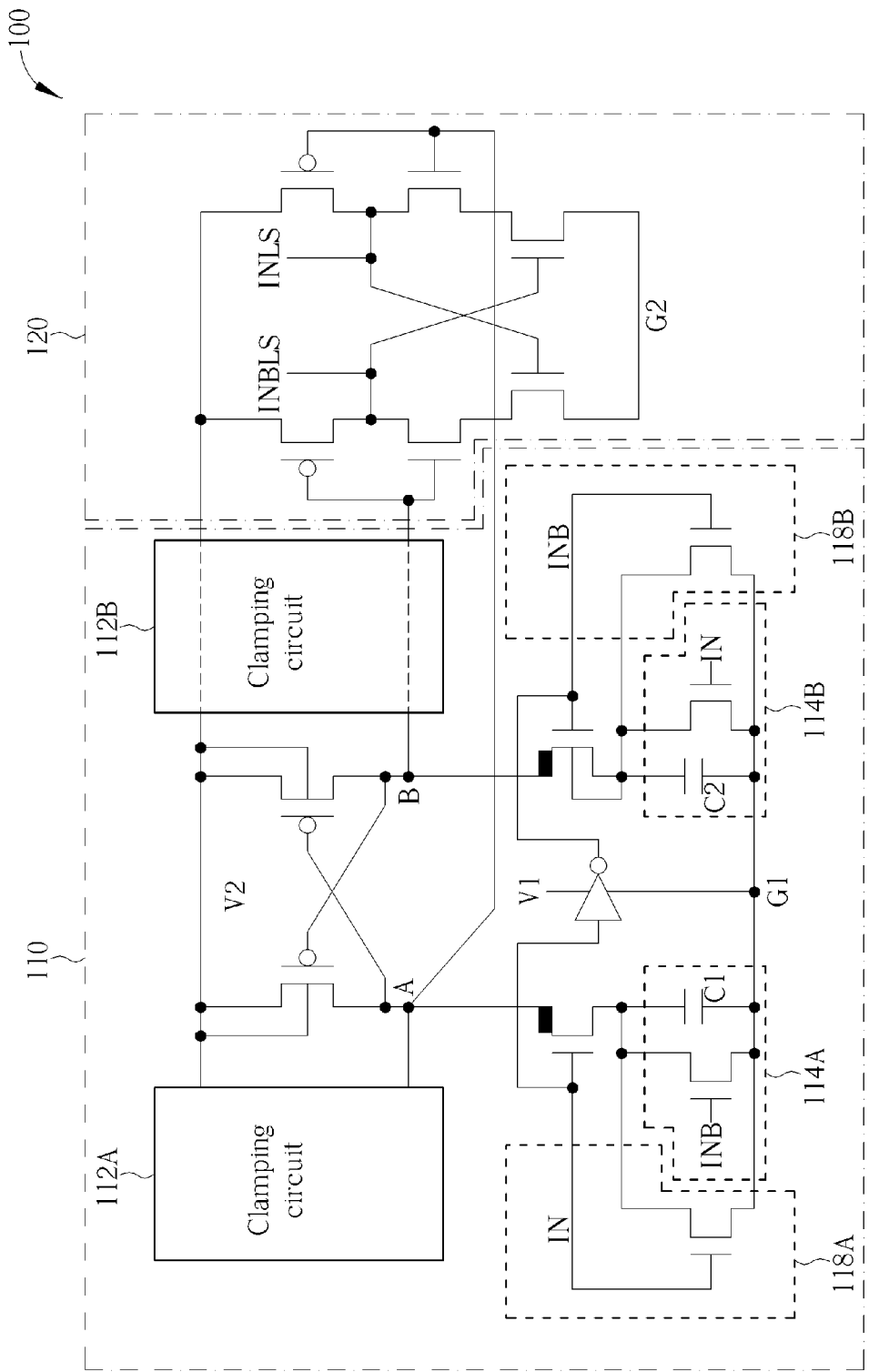
FIG. 7 illustrates some implementation details of the multiple sets of parallel paths involved with the apparatus shown in FIG. 1 according to another embodiment of the present invention.

FIG. 7 illustrates some implementation details of the multiple sets of parallel paths involved with the apparatus 100 shown in FIG. 1 according to another embodiment of the present invention. In comparison with the architecture shown in FIG. 3, the resistors R1 and R2 and the current sources I1 and I2 can be removed in this embodiment. In addition, the switching unit within the bias circuit 118A and the switching unit within the bias circuit 118B have been changed to have other connection arrangements, respectively, so as to be controlled by the input signal at the input terminal IN and the input signal at the input terminal INB, respectively. Please note that, in this embodiment, it is unnecessary that the switching unit within the bias circuit 118A and the switching unit within the bias circuit 118B are HV devices. For brevity, similar descriptions for this embodiment are not repeated in detail here.

According to some embodiments of the present invention, such as the embodiments respectively shown in FIGS. 2-6, the first path may comprise two sub-paths that are connected in parallel (e.g. the sub-paths below the terminal AA, or the sub-paths below the terminal BB, in any of these embodiments), and the aforementioned at least one passive component (e.g. the capacitor C1, or the capacitor C2) may be positioned on one sub-path within the two sub-paths. In addition, the aforementioned hybrid current control circuit may comprise another switching unit (e.g. the switching unit connected in parallel with the capacitor C1, or the switching unit connected in parallel with the capacitor C2) that is positioned on another sub-path within the two sub-paths. For example, the first switching unit may be controlled by a first control signal within the control signals, the second switching unit may be controlled by a second control signal within the control signals, and the other switching unit may be controlled by the inverted signal of the first control signal. This is for illustrative purposes only, and is not meant to be a limitation of the present invention. According to some embodiments of the present invention, such as the embodiments shown in FIG. 7, the first path may comprise two sub-paths that are connected in parallel (e.g. the sub-paths respectively passing through the components of the virtual short circuit 114A, or the sub-paths respectively passing through the components of the virtual short circuit 114B, in any of these embodiments). In addition, the aforementioned at least one passive component (e.g. the capacitor C1, or the capacitor C2) may be positioned on one sub-path within the two sub-paths, and the first switching unit (e.g. the switching unit connected in parallel with the capacitor C1 and positioned within the virtual short circuit 114A, or the switching unit connected in parallel with the capacitor C2 and positioned within the virtual short circuit 114B) may be positioned on another sub-path within the two sub-paths. Additionally, the second path and the two sub-paths are connected in parallel. For example, the first switching unit may be controlled by a first control signal within the control signals, and the second switching unit is controlled by a second control signal within the control signals, where one control signal within the first control signal and the second control signal is an inverted signal of another control signal within the first control signal and the second control signal.

Figure 8:
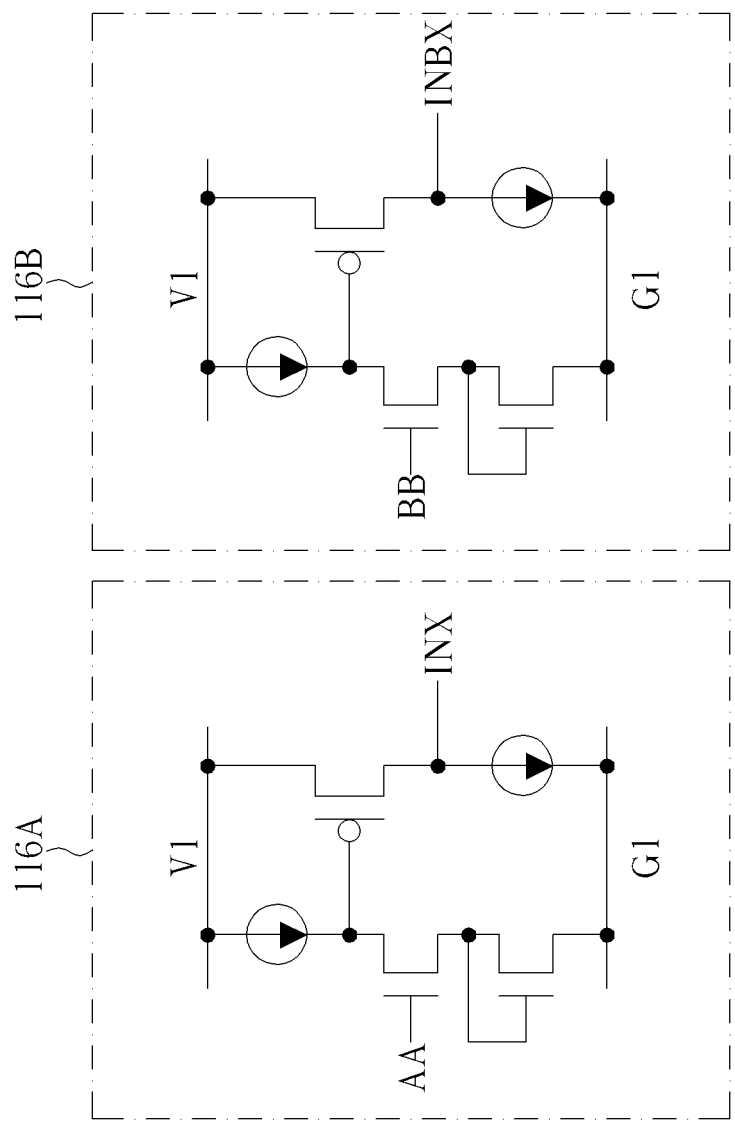
FIG. 8 illustrates a set of voltage detection modules involved with the apparatus shown in FIG. 1 according to an embodiment of the present invention.

FIG. 8 illustrates a set of voltage detection modules 116A and 116B involved with the apparatus 100 shown in FIG. 1 according to an embodiment of the present invention. In this embodiment, the aforementioned first switching unit (e.g. the switching unit M1, or the switching unit M2) may be controlled by a first control signal within the control signals, and the aforementioned second switching unit (e.g. the switching unit M3, or the switching unit M4) may be controlled by a second control signal within the control signals. For example, the switching unit M1 may be controlled by the input signal at the input terminal IN, and the switching unit M3 may be controlled by the signal at the terminal INX, such as the output of the voltage detection module 116A. In another example, the switching unit M2 may be controlled by the input signal at the input terminal INB, and the switching unit M4 may be controlled by the signal at the terminal INBX, such as the output of the voltage detection module 116B.

According to this embodiment, the input stage 110 may comprise this set of voltage detection modules 116A and 116B, and a voltage detection module within the set of voltage detection modules 116A and 116B may be coupled between the first switching unit and the second switching unit mentioned above. In addition, this voltage detection module, such as the voltage detection module 116A or the voltage detection module 116B, may be arranged for detecting a voltage level at a node (e.g. the terminal AA for the detection of the voltage detection module 116A, or the terminal BB for the detection of the voltage detection module 116B) between the first switching unit (e.g. the switching unit M1, or the switching unit M2) and the aforementioned at least one passive component (e.g. the capacitor C1, or the capacitor C2), to generate the second control signal according to the voltage level at this node. For example, the voltage detection module 116A may detect the voltage level at the terminal AA between the switching unit M1 and the capacitor C1, to generate the control signal INX according to the voltage level at the terminal AA. In another example, the voltage detection module 116B may detect the voltage level at the terminal BB between the switching unit M2 and the capacitor C2, to generate the control signal INBX according to the voltage level at the terminal BB.

As shown in FIG. 8, this voltage detection module, such as the voltage detection module 116A or the voltage detection module 116B, may comprise a plurality of MOSFETs (e.g. the PMOSFET and the NMOSFETs within the voltage detection module 116A, or the PMOSFET and the NMOSFETs within the voltage detection module 116B), at least one of which is coupled to this node (e.g. the terminal AA, or the terminal BB) to detect the voltage level at this node, and these MOSFETs may be arranged for performing switching control operations within this voltage detection module, respectively. For example, the MOSFETs in the voltage detection module 116A are electrically connected to the terminal AA directly or indirectly, and the switching operation of at least one of these MOSFETs may be controlled in response to the voltage level at the terminal AA. In another example, the MOSFETs in the voltage detection module 116B are electrically connected to the terminal BB directly or indirectly, and the switching operation of at least one of these MOSFETs may be controlled in response to the voltage level at the terminal BB. In addition, this voltage detection module, such as the voltage detection module 116A or the voltage detection module 116B, may further comprise a plurality of current sources (e.g. the current source within the voltage detection module 116A, or the current source within the voltage detection module 116B) coupled to the plurality of MOSFETs mentioned in this embodiment, and these current sources may be arranged for controlling currents on a plurality of paths within this voltage detection module, respectively, where the second control signal may be obtained from a node (e.g. the terminal INX, or the terminal INBX) between one of the plurality of MOSFETs and one of the plurality of current sources in this embodiment.

According to some embodiments of the present invention, such as the embodiments respectively shown in FIGS. 2-6, the apparatus 100 may be equipped with this set of voltage detection modules 116A and 116B. As a result of utilizing this set of voltage detection modules 116A and 116B, a turn-on time of the second switching unit under control of the second control signal may be less than a turn-on time of the first switching unit under control of the first control signal. For example, the turn-on time of the second switching unit under control of the second control signal may be selectively suppressed to be zero. This is for illustrative purposes only, and is not meant to be a limitation of the present invention. For example, this set of voltage detection modules 116A and 116B may be replaced by other component(s).

According to some embodiments of the present invention, such as the embodiments respectively shown in FIGS. 2-6, the first switching unit (e.g. the switching unit M1, or the switching unit M2) may be controlled by the first control signal (e.g. the input signal at the input terminal IN, or the input signal at the input terminal INB) within the control signals, and the second switching unit (e.g. the switching unit M3, or the switching unit M4) may be controlled by the second control signal (e.g. the signal at the terminal INX, or the signal at the terminal INBX) within the control signals. In addition, the input stage 110 may comprise a control signal generator that is coupled to the second switching unit in these embodiments, and this control signal generator may be arranged for generating the second control signal by converting the first control signal into the second control signal. As a result of utilizing the control signal generator that is designed for replacing the set of voltage detection modules 116A and 116B shown in FIG. 8, the aforementioned turn-on time of the second switching unit under control of the second control signal may be less than the aforementioned turn-on time of the first switching unit under control of the first control signal. For example, the turn-on time of the second switching unit under control of the second control signal may be selectively suppressed to be zero. Examples of the control signal generator may include, but not limited to, the control signal generators 117A and 117B in any of the embodiments respectively shown in FIGS. 11-14.

Figure 9:
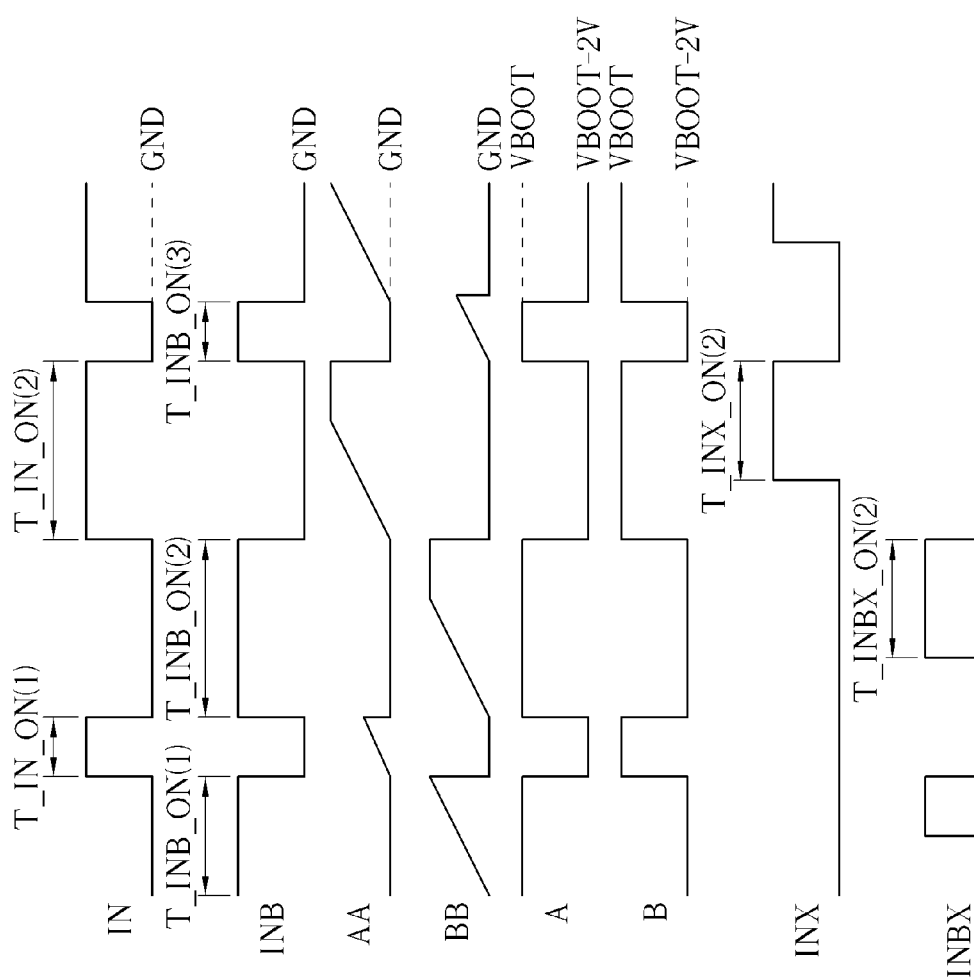
FIG. 9 illustrates a timing chart of associated signals involved with the apparatus shown in FIG. 1 according to an embodiment of the present invention.

FIG. 9 illustrates a timing chart of associated signals involved with the apparatus 100 shown in FIG. 1 according to an embodiment of the present invention, where these signals are depicted with waveforms at the associated terminals or nodes, such as the input terminals IN and INB, the terminals AA and BB, the intermediate nodes A and B, and the terminals INX and INBX, and therefore can be labeled with the same names of these terminals or nodes, respectively. For example, the low level GND of any signal within the input signals at the input terminals IN and INB and the signals at the terminals AA and BB can be equivalent to the reference voltage level G1, and the high level and the low level of any signal within the signals at the intermediate nodes A and B can be equivalent to the boot voltage VBOOT and the boot voltage minus 2 Volts (V) (i.e. the voltage level of (VBOOT−2V) in this embodiment), respectively.

According to this embodiment, the aforementioned turn-on time of the second switching unit (e.g. the switching unit M3, or the switching unit M4) under control of the second control signal may be less than the aforementioned turn-on time of the first switching unit (e.g. the switching unit M1, or the switching unit M2) under control of the first control signal. For example, in the period corresponding to the turn-on time T_IN_ON(2) of the input signal at the input terminal IN, the turn-on time T_INX_ON(2) of the switching unit M3 under control of the control signal at the terminal INX is less than the turn-on time T_IN_ON(2) of the switching unit M1 under control of the input signal at the input terminal IN. In another example, in period corresponding to the turn-on time T_INB_ON(2) of the input signal at the input terminal INB, the turn-on time T_INBX_ON(2) of the switching unit M4 under control of the control signal at the terminal INBX is less than the turn-on time T_INB_ON(2) of the switching unit M2 under control of the input signal at the input terminal INB. In addition, the turn-on time of the second switching unit (e.g. the switching unit M3, or the switching unit M4) under control of the second control signal. For example, in the period corresponding to the turn-on time T_IN_ON(1) of the input signal at the input terminal IN, the turn-on time of the switching unit M3 under control of the control signal at the terminal INX has been suppressed to be zero, since the voltage level of the control signal at the terminal INX is kept at the low level thereof within this period. In another example, in the period corresponding to the turn-on time T_INB_ON(3) of the input signal at the input terminal INB, the turn-on time of the switching unit M4 under control of the control signal at the terminal INBX has been suppressed to be zero, since the voltage level of the control signal at the terminal INBX is kept at the low level thereof within this period.

Figure 10:
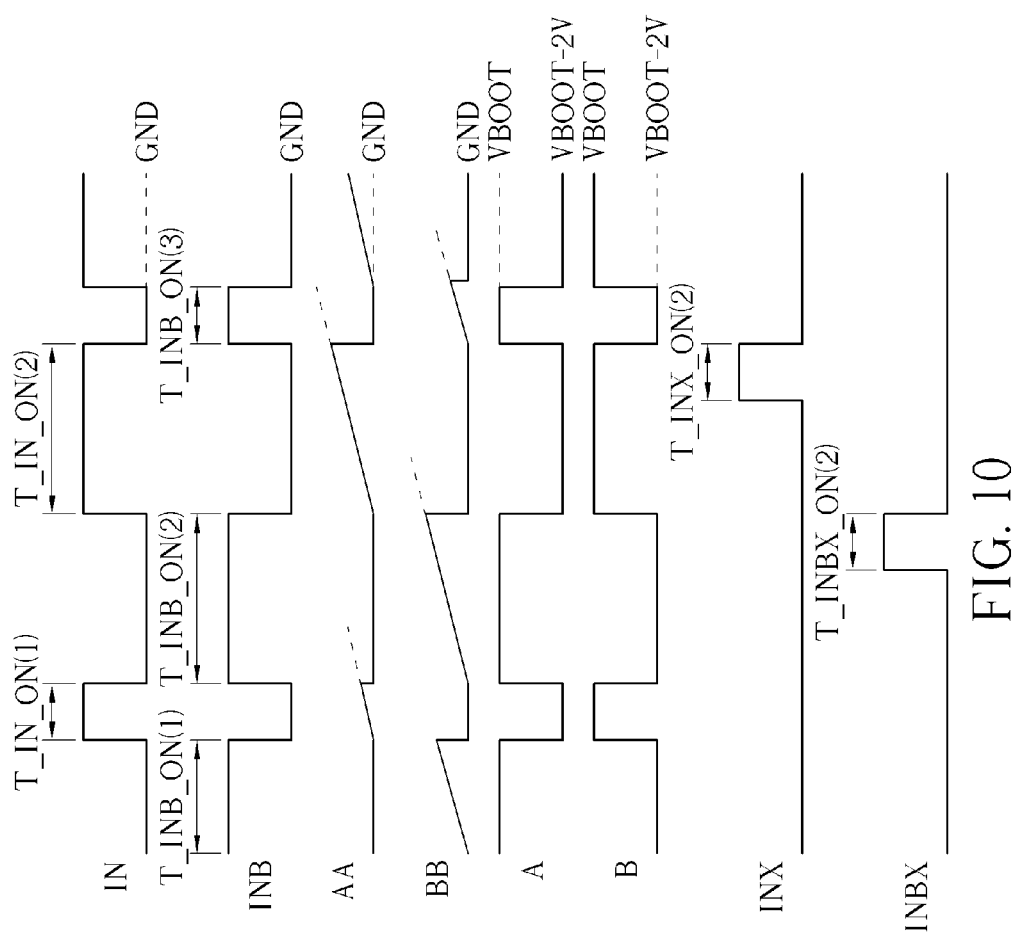
FIG. 10 illustrates a timing chart of associated signals involved with the apparatus shown in FIG. 1 according to another embodiment of the present invention.
Figure 11:
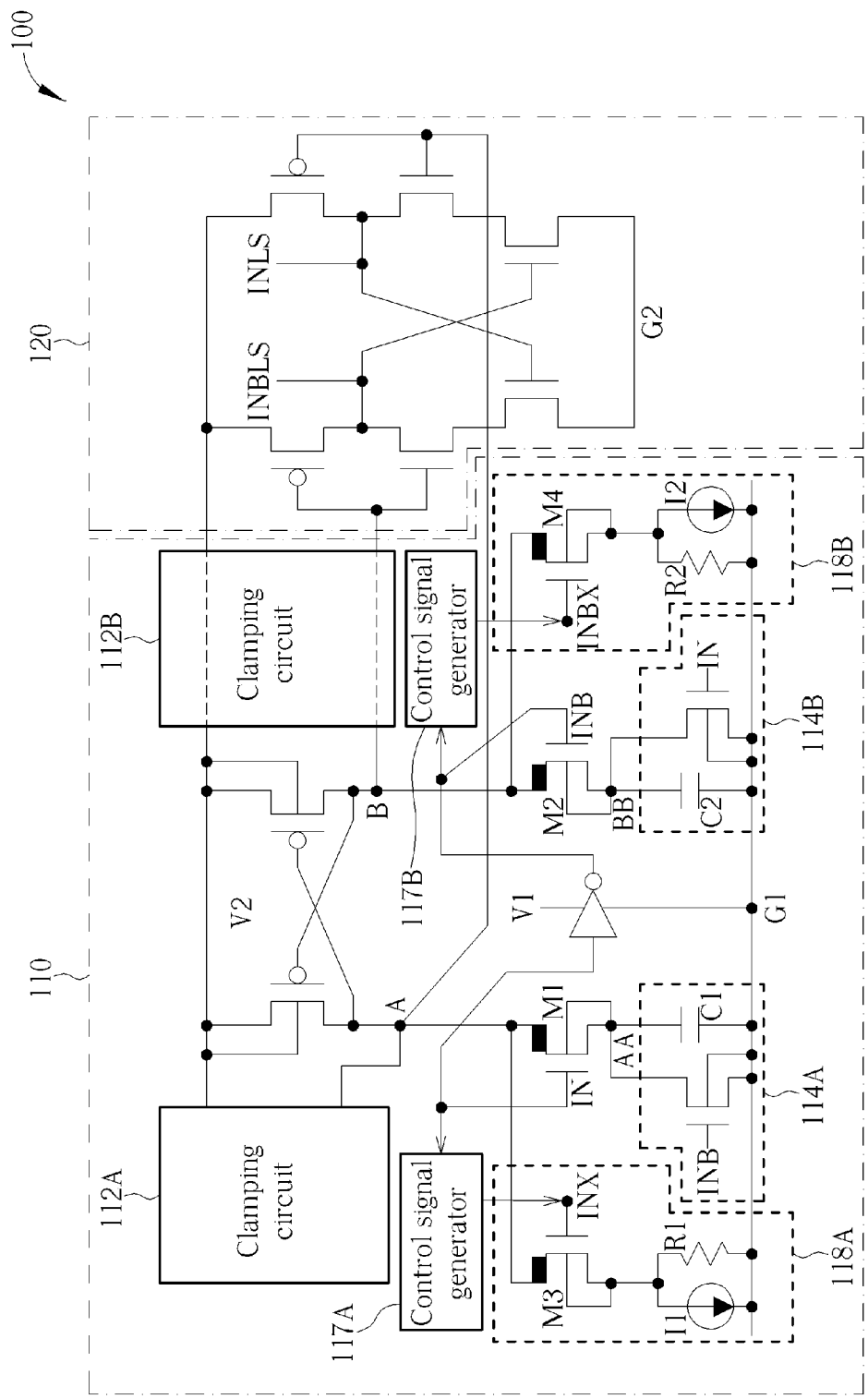
FIG. 11 illustrates further implementation details of the architecture shown in FIG. 3 according to an embodiment of the present invention.
Figure 12:
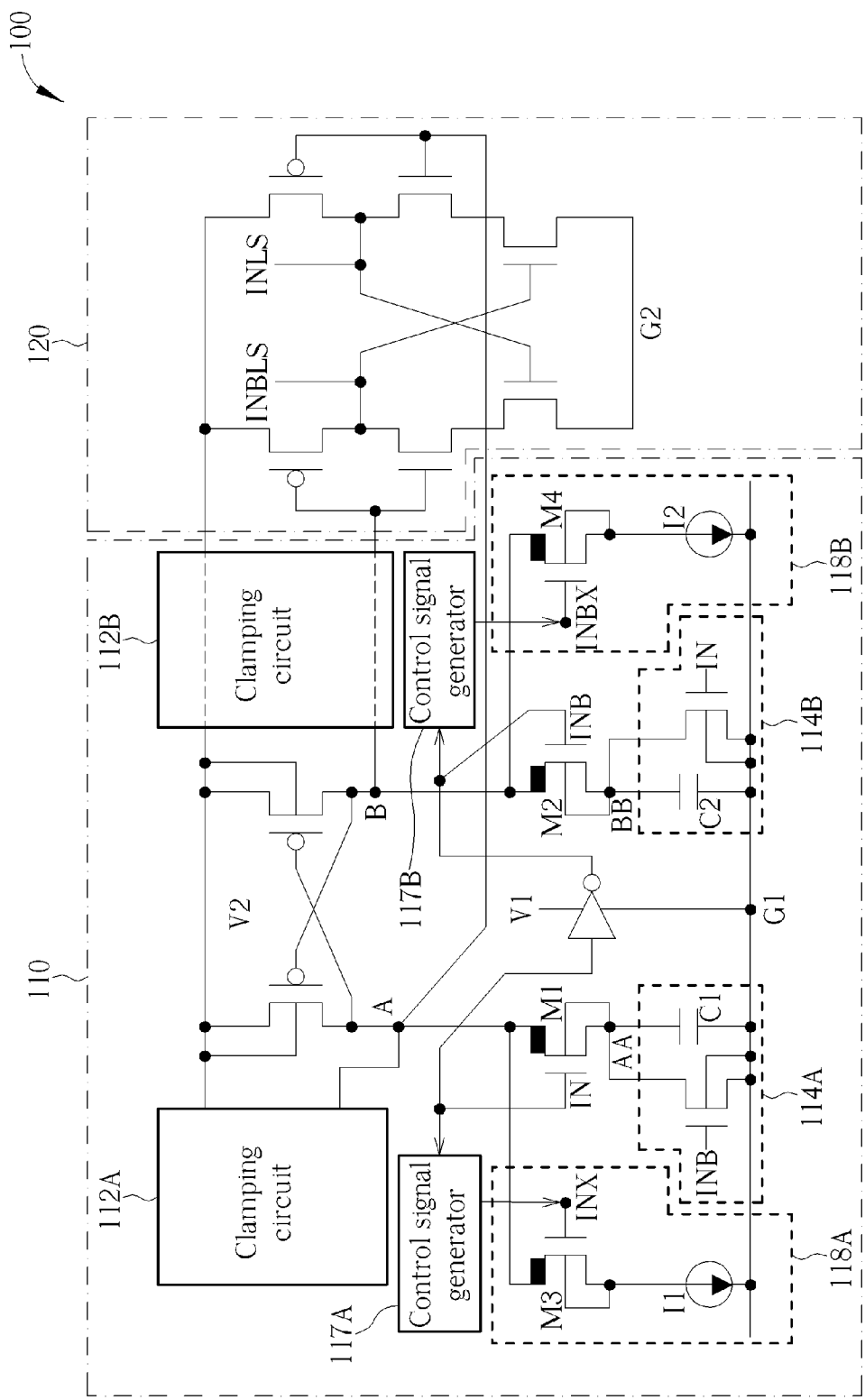
FIG. 12 illustrates further implementation details of the architecture shown in FIG. 4 according to an embodiment of the present invention.
Figure 13:
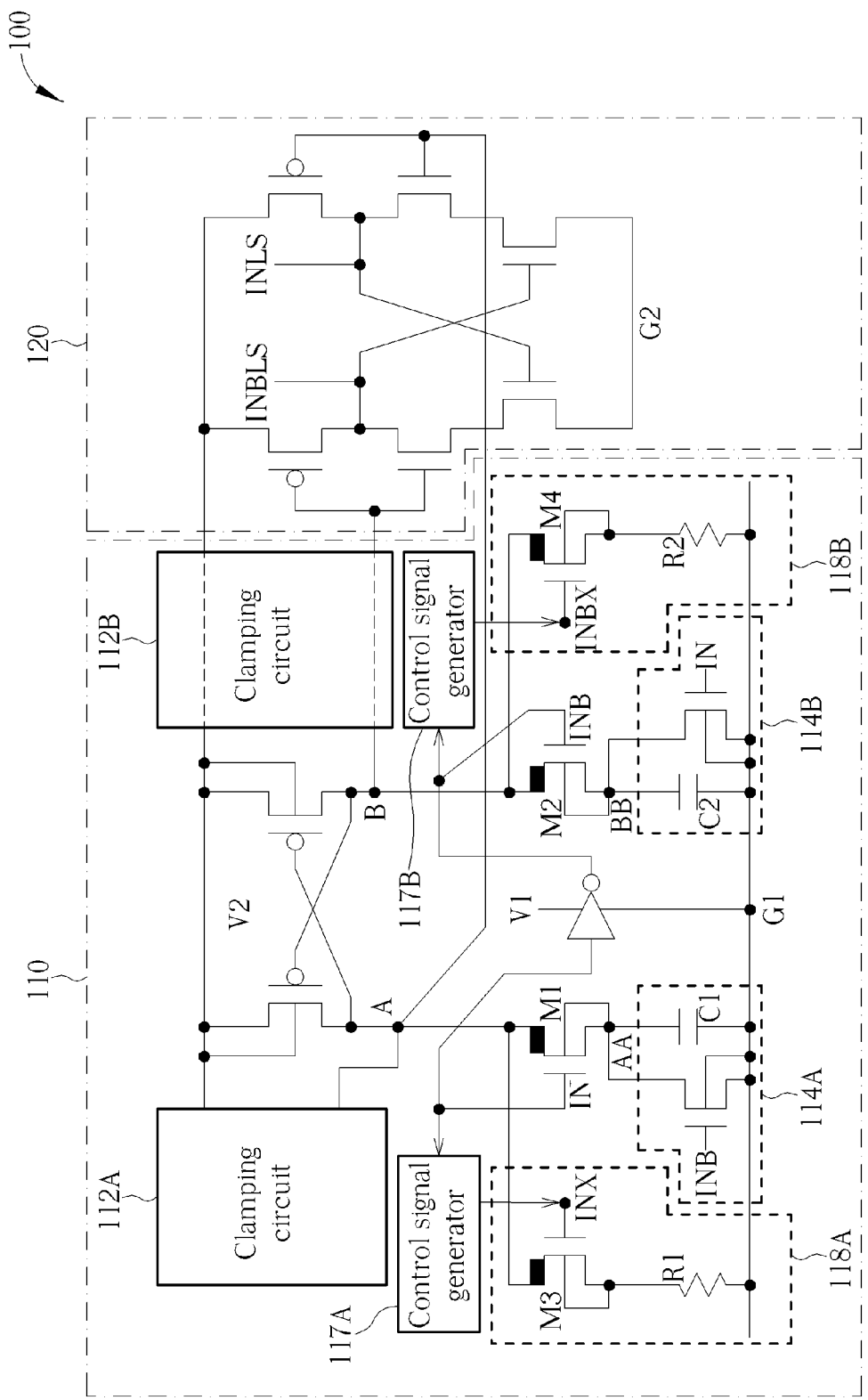
FIG. 13 illustrates further implementation details of the architecture shown in FIG. 5 according to an embodiment of the present invention.
Figure 14:
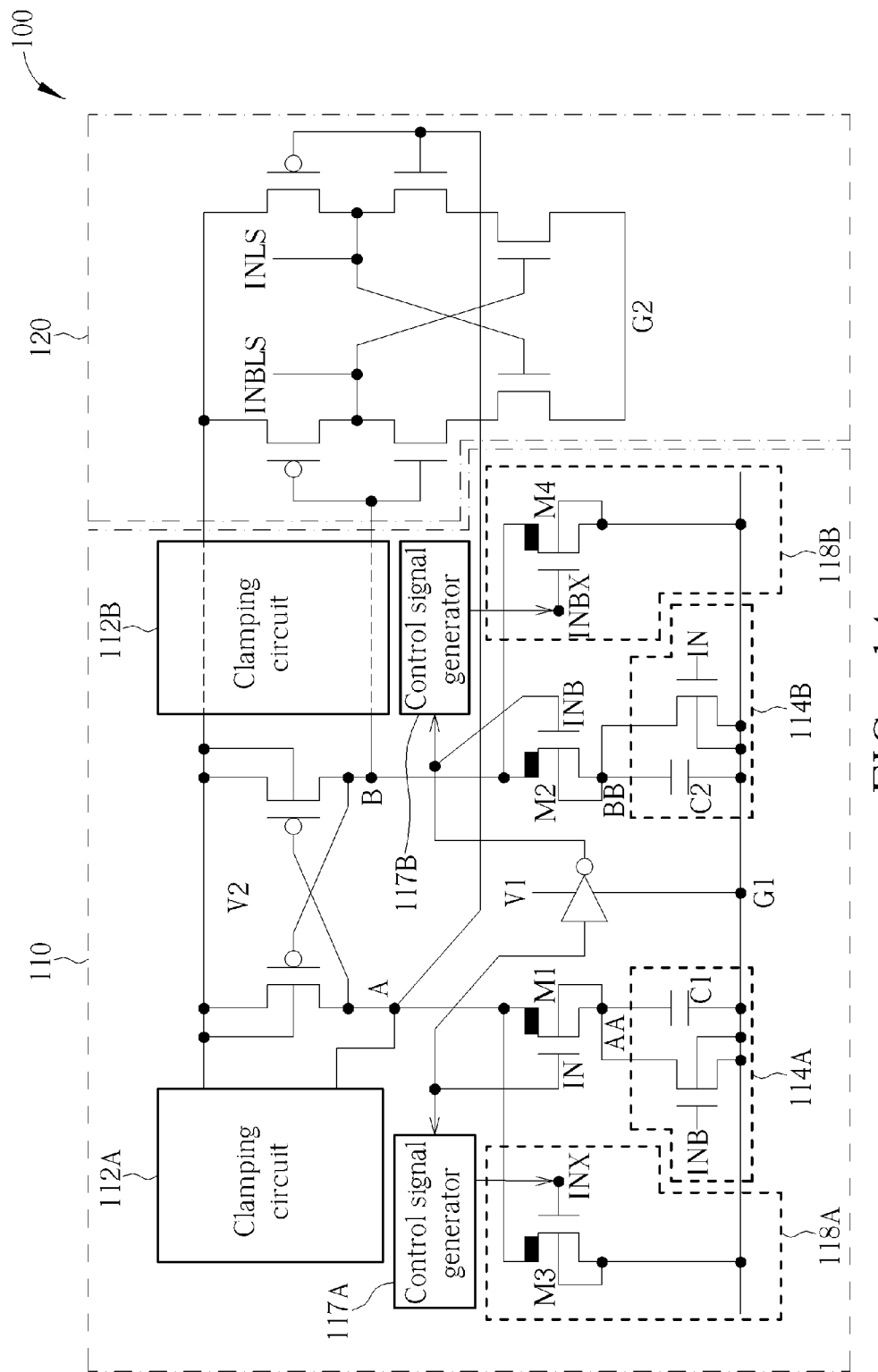
FIG. 14 illustrates further implementation details of the architecture shown in FIG. 6 according to an embodiment of the present invention.

FIG. 10 illustrates a timing chart of associated signals involved with the apparatus 100 shown in FIG. 1 according to another embodiment of the present invention, where these signals are depicted with waveforms at the associated terminals or nodes, such as the input terminals IN and INB, the terminals AA and BB, the intermediate nodes A and B, and the terminals INX and INBX, and therefore can be labeled with the same names of these terminals or nodes, respectively. Please note that this embodiment may be used for illustrating discharge current on time reduction. In comparison with the embodiment shown in FIG. 9, the capacitance values of the capacitors C1 and C2 may be increased, respectively, to achieve a lower slew rate for better quiescent current of the boot voltage VBOOT in this embodiment. Thus, in comparison with the waveforms shown in FIG. 9, the slopes of some partial waveforms at the terminals AA and BB are decreased in this embodiment, respectively. As a result, some partial waveforms at the terminals INX and INBX are changed correspondingly.

According to this embodiment, the aforementioned turn-on time of the second switching unit (e.g. the switching unit M3, or the switching unit M4) under control of the second control signal may be less than the aforementioned turn-on time of the first switching unit (e.g. the switching unit M1, or the switching unit M2) under control of the first control signal. For example, in the period corresponding to the turn-on time T_IN_ON(2) of the input signal at the input terminal IN, the turn-on time T_INX_ON(2) of the switching unit M3 under control of the control signal at the terminal INX is less than the turn-on time T_IN_ON(2) of the switching unit M1 under control of the input signal at the input terminal IN. In another example, in period corresponding to the turn-on time T_INB_ON(2) of the input signal at the input terminal INB, the turn-on time T_INBX_ON(2) of the switching unit M4 under control of the control signal at the terminal INBX is less than the turn-on time T_INB_ON(2) of the switching unit M2 under control of the input signal at the input terminal INB. In addition, the turn-on time of the second switching unit (e.g. the switching unit M3, or the switching unit M4) under control of the second control signal. For example, in the period corresponding to the turn-on time T_IN_ON(1) of the input signal at the input terminal IN, the turn-on time of the switching unit M3 under control of the control signal at the terminal INX has been suppressed to be zero, since the voltage level of the control signal at the terminal INX is kept at the low level thereof within this period. In another example, in the period corresponding to the turn-on time T_INB_ON(1) of the input signal at the input terminal INB, the turn-on time of the switching unit M4 under control of the control signal at the terminal INBX has been suppressed to be zero, since the voltage level of the control signal at the terminal INBX is kept at the low level thereof within this period.

According to some embodiments of the present invention, such as the embodiment shown in FIG. 7, each set of the multiple sets of parallel paths may comprise a first path on which a first switching unit is positioned (e.g. the signal path passing through the switching unit connected in parallel with the virtual short circuit 114A and positioned within the bias circuit 118A, or the signal path passing through the switching unit connected in parallel with the virtual short circuit 114B and positioned within the bias circuit 118B), and may comprise a second path on which a second switching unit is positioned (e.g. the signal path passing through the switching unit connected in parallel with the capacitor C1 and positioned within the virtual short circuit 114A, or the signal path passing through the switching unit connected in parallel with the capacitor C2 and positioned within the virtual short circuit 114B), and may further comprise a third path on which at least one passive component is positioned (e.g. the signal path passing through the capacitor C1, or the signal path passing through the capacitor C2). In addition, the first switching unit and the second switching unit can be controlled by different control signals, respectively.

According to some embodiments, the aforementioned at least one input signal may correspond to a first power domain, and the aforementioned at least one output signal may correspond to a second power domain. In addition, there may be four switching units M1, M2, M3, and M4 electrically connected to the associated signals which are related to the first power domain. For example, these four switching units M1, M2, M3, and M4 can be implemented as HV devices having large parasitic capacitance. Additionally, the apparatus 100 may comprise at least one voltage detector such as the set of voltage detection modules 116A and 116B shown in FIG. 8, for check the voltage levels at the terminals AA and BB, in order to control the discharging time of the corresponding signal path(s) within the bias circuit 118A (e.g. the sub-path passing through the current source I1 and/or the sub-path passing through the resistor R1) and the discharging time of the corresponding signal path(s) within the bias circuit 118B (e.g. the sub-path passing through the current source I2 and/or the sub-path passing through the resistor R2). For brevity, similar descriptions for these embodiments are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for performing level shift control in an electronic device, the apparatus comprising at least one portion of the electronic device, the apparatus comprising:
   an input stage, positioned in a level shifter of the electronic device, arranged for receiving at least one input signal of the level shifter through at least one input terminal of the input stage and controlling voltage levels of a set of intermediate nodes according to the at least one input signal, wherein the input stage comprises:
      a hybrid current control circuit, coupled to the at least one input terminal, arranged for performing current control for the input stage, wherein the hybrid current control circuit is equipped with multiple sets of parallel paths for controlling currents passing through the set of intermediate nodes, respectively, each set of the multiple sets of parallel paths comprises a first path on which a first switching unit and at least one passive component are positioned, and further comprises a second path on which a second switching unit is positioned, and the first switching unit and the second switching unit are controlled by different control signals, respectively; and
   an output stage, positioned in the level shifter and coupled to the input stage through the set of intermediate nodes, arranged for driving at least one output signal of the level shifter through at least one output terminal of the output stage and controlling at least one voltage level of the at least one output terminal according to the voltage levels of the set of intermediate nodes.

2. The apparatus of claim 1, wherein the input stage further comprises:
   a set of switching units, coupled to the at least one input terminal, arranged for controlling the voltage levels of the set of intermediate nodes in response to the at least one input signal, wherein according to the at least one input signal, a switching unit of the set of switching units selectively couples one of the set of intermediate nodes to a predetermined voltage level supplied to the level shifter.

3. The apparatus of claim 1, wherein the at least one input terminal comprises a first input terminal and a second input terminal; and the apparatus further comprises:
   an inverter, positioned in the level shifter and coupled between the first input terminal and the second input terminal, arranged for inverting the at least one input signal to generate an inverted signal, wherein the first input terminal is arranged to receive the at least one input signal, and the second input terminal is arranged to receive the inverted signal.

4. The apparatus of claim 1, wherein the input stage comprises:
   a plurality of switching units, each of which is positioned on a path within the multiple sets of parallel paths, wherein the plurality of switching units comprises the first switching unit on the first path and the second switching unit on the second path.

5. The apparatus of claim 4, wherein the hybrid current control circuit comprises:
   a plurality of capacitors, at least one capacitor of which is positioned on the first path and is utilized as the at least one passive component.

6. The apparatus of claim 4, wherein the hybrid current control circuit comprises:
   a plurality of current sources, at least one current source of which is positioned on the second path; or
   a plurality of resistors, at least one resistor of which is positioned on the second path.

7. The apparatus of claim 4, wherein the hybrid current control circuit comprises:
   a plurality of current sources, at least one current source of which is positioned on the second path; and
   a plurality of resistors, at least one resistor of which is positioned on the second path.

8. The apparatus of claim 1, wherein a first set of parallel paths within the multiple sets of parallel paths is arranged for controlling the current passing through one intermediate node within the set of intermediate nodes, and a second set of parallel paths within the multiple sets of parallel paths is arranged for controlling the current passing through another intermediate node within the set of intermediate nodes.

9. The apparatus of claim 1, further comprising:
   a set of clamping circuits, positioned in the level shifter and respectively coupled to the set of intermediate nodes, arranged for clamping the voltage levels of the set of intermediate nodes, respectively.

10. The apparatus of claim 1, wherein the first switching unit is controlled by a first control signal within the control signals, and the second switching unit is controlled by a second control signal within the control signals; and the input stage comprises:
    a voltage detection module, coupled between the first switching unit and the second switching unit, arranged for detecting a voltage level at a node between the first switching unit and the at least one passive component, to generate the second control signal according to the voltage level at the node.

11. The apparatus of claim 10, wherein the voltage detection module comprises:
    a plurality of Metal Oxide Semiconductor Field Effect Transistors (MOSFETs), at least one of which is coupled to the node to detect the voltage level at the node, arranged for performing switching control operations within the voltage detection module, respectively; and
    a plurality of current sources, coupled to the plurality of MOSFETs, arranged for controlling currents on a plurality of paths within the voltage detection module, respectively, wherein the second control signal is obtained from a node between one of the plurality of MOSFETs and one of the plurality of current sources.

12. The apparatus of claim 10, wherein a turn-on time of the second switching unit under control of the second control signal is less than a turn-on time of the first switching unit under control of the first control signal.

13. The apparatus of claim 12, wherein the turn-on time of the second switching unit under control of the second control signal is selectively suppressed to be zero.

14. The apparatus of claim 1, wherein the first switching unit is controlled by a first control signal within the control signals, and the second switching unit is controlled by a second control signal within the control signals; and the input stage comprises:
    a control signal generator, coupled to the second switching unit, arranged for generating the second control signal by converting the first control signal into the second control signal, wherein a turn-on time of the second switching unit under control of the second control signal is less than a turn-on time of the first switching unit under control of the first control signal.

15. The apparatus of claim 14, wherein the turn-on time of the second switching unit under control of the second control signal is selectively suppressed to be zero.

16. The apparatus of claim 1, wherein the first path comprises two sub-paths that are connected in parallel, and the at least one passive component is positioned on one sub-path within the two sub-paths; and the hybrid current control circuit comprises:
   another switching unit, positioned on another sub-path within the two sub-paths.

17. The apparatus of claim 16, wherein the first switching unit is controlled by a first control signal within the control signals, the second switching unit is controlled by a second control signal within the control signals, and the other switching unit is controlled by an inverted signal of the first control signal.

18. The apparatus of claim 1, wherein the first path comprises two sub-paths that are connected in parallel, wherein the at least one passive component is positioned on one sub-path within the two sub-paths, and the first switching unit is positioned on another sub-path within the two sub-paths; and the second path and the two sub-paths are connected in parallel.

19. The apparatus of claim 18, wherein the first switching unit is controlled by a first control signal within the control signals, and the second switching unit is controlled by a second control signal within the control signals; and one control signal within the first control signal and the second control signal is an inverted signal of another control signal within the first control signal and the second control signal.

20. An apparatus for performing level shift control in an electronic device, the apparatus comprising at least one portion of the electronic device, the apparatus comprising:
   an input stage, positioned in a level shifter of the electronic device, arranged for receiving at least one input signal of the level shifter through at least one input terminal of the input stage and controlling voltage levels of a set of intermediate nodes according to the at least one input signal, wherein the input stage comprises:
      a hybrid current control circuit, coupled to the at least one input terminal, arranged for performing current control for the input stage, wherein the hybrid current control circuit is equipped with multiple sets of parallel paths for controlling currents passing through the set of intermediate nodes, respectively, each set of the multiple sets of parallel paths comprises a first path on which a first switching unit is positioned, and comprises a second path on which a second switching unit is positioned, and further comprises a third path on which at least one passive component is positioned, and the first switching unit and the second switching unit are controlled by different control signals, respectively; and
   an output stage, positioned in the level shifter and coupled to the input stage through the set of intermediate nodes, arranged for driving at least one output signal of the level shifter through at least one output terminal of the output stage and controlling at least one voltage level of the at least one output terminal according to the voltage levels of the set of intermediate nodes.

21. An apparatus for performing level shift control in an electronic device, the apparatus comprising at least one portion of the electronic device, the apparatus comprising:
   an input stage, positioned in a level shifter of the electronic device, arranged for receiving at least one input signal of the level shifter through at least one input terminal of the input stage and controlling voltage levels of a set of intermediate nodes according to the at least one input signal, wherein the input stage comprises:
      a hybrid current control circuit, coupled to the at least one input terminal, arranged for performing current control for the input stage, wherein the hybrid current control circuit is equipped with multiple sets of parallel paths for controlling currents passing through the set of intermediate nodes, respectively, each set of the multiple sets of parallel paths comprises a first path on which a first switching unit and at least one component are positioned, and further comprises a second path on which a second switching unit is positioned, and the first switching unit and the second switching unit are controlled by different control signals, respectively; and
   an output stage, positioned in the level shifter and coupled to the input stage through the set of intermediate nodes, arranged for driving at least one output signal of the level shifter through at least one output terminal of the output stage and controlling at least one voltage level of the at least one output terminal according to the voltage levels of the set of intermediate nodes.

22. The apparatus of claim 21, wherein the at least one component comprises at least one resistor.

23. The apparatus of claim 21, wherein the at least one component comprises at least one capacitor.

24. The apparatus of claim 21, wherein the at least one component comprises one or a combination of at least one active component and at least one passive component.

* * * * *